United States Patent [19]

Takeuchi et al.

[11] Patent Number: 5,744,224
[45] Date of Patent: Apr. 28, 1998

[54] BOARD FOR MOUNTING SEMICONDUCTOR CHIP

[75] Inventors: Yukiharu Takeuchi; Shigetsugu Muramatsu, both of Nagano, Japan

[73] Assignee: Shinko Electric Industries Co., Ltd., Nagano, Japan

[21] Appl. No.: 550,995

[22] Filed: Oct. 31, 1995

[30] Foreign Application Priority Data

Nov. 29, 1994 [JP] Japan .................................. 6-294639

[51] Int. Cl.$^6$ .......................... B32B 15/04; H01L 23/498
[52] U.S. Cl. .................... 428/209; 428/411.1; 428/457; 428/901; 361/774; 361/777; 174/268
[58] Field of Search .................... 428/209, 901, 428/411.1, 457; 361/774, 777; 174/268

[56] References Cited

U.S. PATENT DOCUMENTS

| | | |
|---|---|---|
| 3,833,838 | 9/1974 | Christiansen . |
| 4,495,377 | 1/1985 | Johnson et al. .................. 174/68.5 |
| 5,012,389 | 4/1991 | Perry . |
| 5,289,346 | 2/1994 | Carey et al. ..................... 361/777 |
| 5,348,792 | 9/1994 | Hattori et al. ..................... 428/209 |
| 5,365,409 | 11/1994 | Kwon et al. ...................... 361/813 |

FOREIGN PATENT DOCUMENTS 2-046741  2/1990  Japan .

OTHER PUBLICATIONS

*Patent Abstracts of Japan*, vol. 7, No. 166 (E-188), Jul. 21, 1958 & JP-A-58 074059 (Tokyo Shibaura Denki KK), May 4, 1983.

*Patent Abstracts of Japan*, vol. 10, No. 340 (E-455), Nov. 18, 1986 & JP-A-61 144046 (Mitsubishi Electric Corp), Jul. 1, 1986.

*Patent Abstracts of Japan*, vol. 13, No. 486 (E-840), Nov. 6, 1989 & JP-A-01 194428 (Ibiden Co Ltd), Aug. 4, 1989.

*Patent Abstracts of Japan*, vol. 13, No. 493 (E-842), Nov. 8, 1989 & JP-A-01 198058 (Matsushita Electron Corp), Aug. 9, 1989.

*Patent Abstracts of Japan*, vol. 16, No. 403 (E-1254), Aug. 26, 1992 & JP-A-04 133454 (Ibiden Co Ltd), May 7, 1992.

*Primary Examiner*—Marie Yamnitzky
*Attorney, Agent, or Firm*—Staas & Halsey

[57] ABSTRACT

A semiconductor chip mounting board includes a base material made of resin; a metallized pattern formed on a surface of the base material which defines a die-pad area on which a semiconductor chip is to be mounted; and the metallized pattern comprising a plurality of zigzag shaped pattern lines along imaginary straight line segments radially, outwardly extending from a central position of the die-pad area. The metallized pattern may be a plurality of zigzag shaped pattern portions along imaginary concentric circles having a center at a central position of the die-pad area. Otherwise, the metallized pattern may be a plurality of closed loop shaped frames which are overlapped on each other in a zigzag manner.

22 Claims, 3 Drawing Sheets

BOARD FOR MOUNTING SEMICONDUCTOR CHIP

BACKGROUND OF THE INVENTION

1. Field of the Invention

The present invention generally relates to a board on which a semiconductor chip is mounted and, more particularly, relates to such a board made of plastic material.

2. Description of the Related Art

In a board or substrate for mounting thereon a semiconductor chip used in, such as, a plastic ball grid array (PBGA), a plastic pin grid array (PPGA) or the like, an area of the surface of the board on which a semiconductor chip is mounted, hereinafter referred to simply as a "die-pad", is usually formed with metallized patterns to increase the heat radiation efficiency and to improve the electrical conductivity or other electrical characteristics. These metallized patterns are generally formed by etching a copper foil adhered to the surface of the plastic base board.

In general, these metallized patterns are formed on either one of the surfaces of a semiconductor chip mounting board. Therefore, if such a semiconductor chip mounting board is subjected to any thermal change, mainly heating, since there is a difference in the thermal expansion rates or the thermal shrinkage rates of the base board made of plastic and the metallized patterns, a thermal stress will be exerted to the die-pad and the semiconductor chip mounting board, which may thus be curved or deformed. In particular, a board for a PBGA package is relatively thin and thus may easily be deformed. Thus, such a curvature or deformation will be generated during a making process of a semiconductor chip mounting board or a semiconductor chip assembling process, or when a semiconductor device is being actually used, and will cause an unfavorable defect during the production of semiconductor devices or a reduction in the reliability of the product.

The amount of curvature or deformation in the semiconductor chip mounting board becomes larger, as the difference in a thermal expansion rates or a thermal shrinkage rates of a material of base board and a material of metallized patterns, such as copper foil, becomes larger, or if the area of the metallized patterns becomes larger. To reduce such a curvature or deformation, the total area of the metallized patterns should be reduced as much as possible as can be allowed under the conditions for design, since the selection range in these materials themselves is relatively narrow. Therefore, in the simplest cases, the metallized patterns may be formed as a grill or a lattice, or spot-like patterns.

However, if the metallized patterns consists only of continuous linear patterns, such as a grill or a lattice, a stress may easily be exerted on the board in a certain direction due to the continuity of a number of line patterns and, therefore, such a curvature or deformation may more easily be generated, so that the deformation due to the curvature cannot be sufficiently prevented.

Also, it is necessary that the entire region of the metallized patterns on the die-pad may be easily electrically connected so as to conduct an electroplating process or to supply electric power to the back surface of the semiconductor chip. Therefore, if spot-like metallized patterns are formed on the board, it will be difficult to electrically connect these patterns with a power source or the like. In addition, even if no curvature or deformation is generated (by a thermal expansion rate or a thermal shrinkage of) the metallized patterns on the die-pad, if a plated layer is formed on the metallized patterns, a deformation of the board would be generated due to a stress on the plated layer.

SUMMARY OF THE INVENTION

Accordingly, an object of the present invention is to provide a semiconductor chip mounting board having a die-pad, in which any deformation or curvature of board is prevented and substantially the whole area of the die-pad may be easily electrically connected.

According to the present invention, there is provided a semiconductor chip mounting board comprising: a base material made of resin; a metallized pattern formed on a surface of said base material which defines a die-pad area on which a semiconductor chip is to be mounted; and said metallized pattern comprising a plurality of zigzag shaped pattern lines along imaginary straight line segments radially and outwardly extending from a central position of said die-pad area.

According to another aspect of the present invention, there is provided a semiconductor chip mounting board comprising: a base material made of resin; a metallized pattern formed on a surface of said base material which defines a die-pad area on which a semiconductor chip is to be mounted; and said metallized pattern comprising a plurality of zigzag shaped pattern portions along imaginary concentric circles having a center at a central position of said die-pad area.

In these semiconductor chip mounting boards, since the metallized pattern is arranged in zigzag, a thermal stress which would cause a deformation or curvature of the die-pad does not appear continuously in a certain direction, but is dispersed, so that the generation of curvature of the semiconductor chip mounting board can be reduced. In addition, although the metallized pattern is arranged in zigzag, the pattern is continuously extended over the die-pad area. Therefore, electric power can easily be supplied to the entire metallized pattern.

According to still another aspect of the present invention, there is provided a semiconductor chip mounting board comprising: a base material made of resin; a metallized pattern formed on a surface of said base material which defines a die-pad area on which a semiconductor chip is to be mounted; and said metallized pattern comprising a plurality of closed loop shaped frames which are overlapped to each other in zigzag.

In the same manner as the above, the metallized pattern including a plurality of closed loop shaped frames is arranged in zigzag and, therefore, a thermal stress does not appear continuously along a certain direction, but is dispersed, so that a generation of curvature of the semiconductor chip mounting board can be restricted. Also, the metallized pattern includes a plurality of closed loop shaped frames which are superimposed to each other. Therefore, an electric power can easily be supplied to the metallized pattern entirely.

In one embodiment, the die-pad area is coated with a solder resist, except where the metallized pattern is exposed. Thus, the metallized pattern can be plated with suitable metal to form a plated layer, which is serves to protect the die-pad and to prevent the die-pad from being bent due to thermal stress and stress in the plating process.

DETAILED DESCRIPTION OF THE EMBODIMENTS

Figure 1:
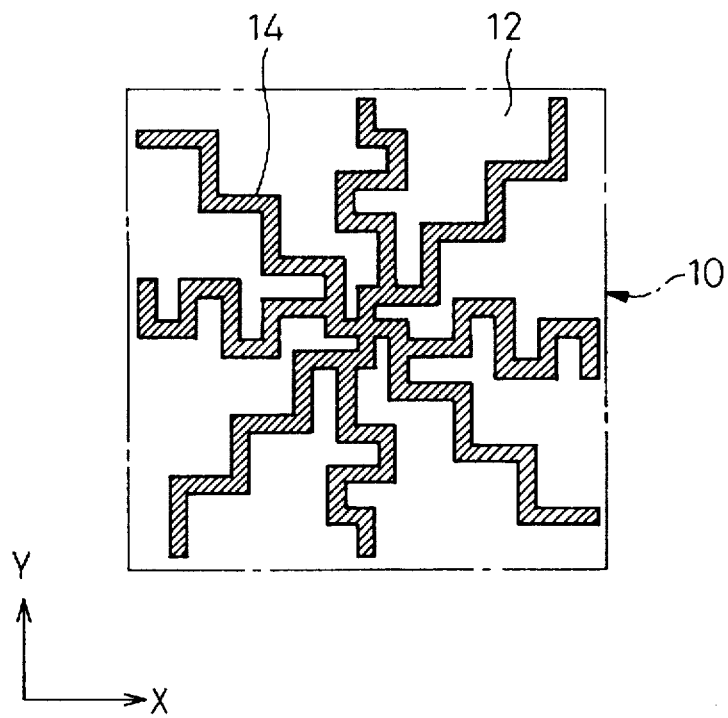
FIG. 1 is a plan view showing a metallized pattern of a die-pad according to a first embodiment of this invention.
Figure 2:
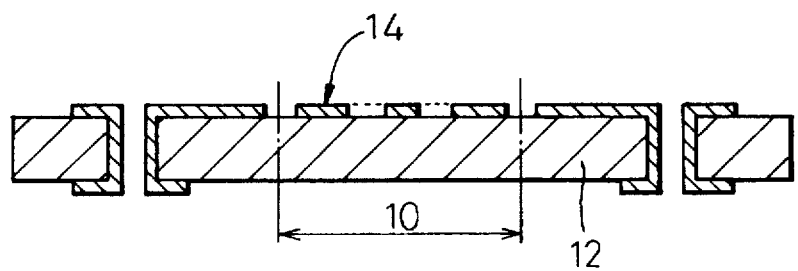
FIG. 2 is a cross-sectional view showing a semiconductor chip mounting board having the die-pad of FIG. 1.

The present invention will now be explained in detail with reference to the embodiments shown in the accompanying drawings. In FIGS. 1 and 2, there is illustrated a first embodiment of a semiconductor chip mounting board or substrate. In FIG. 1, the area enclosed by a dotted-line is a die-pad 10 of a semiconductor chip mounting board on which a semiconductor chip (not shown) is to be mounted. The die-pad 10 is provided with a metallized pattern 14 formed on a plate-like base material 12 made of a suitable material, such as resin. Thus, such a metallized pattern 14 can be formed, for example, by etching a copper foil adhered to one of the surfaces of the base material 12. However, such a metallized pattern 14 can also be formed, for example, by using an additive process, in which a suitable metallized pattern is obtained by plating.

The metallized pattern 14 formed on the die-pad area 10 is arranged in such a manner that a plurality of zigzag shaped pattern lines substantially radially and outwardly extend from an initial point, i.e., a central point of the die-pad 10. It should be noted, however, that the zigzag shaped lines have a number of continuous line segments substantially perpendicular to the continuous adjacent line segments and substantially in parallel to the adjacent but one line segments. In the particular embodiment, the respective line segments of the metallized pattern are bent, at a plurality of points, perpendicular toward the X-axis direction and Y-axis direction, in turn, and also the metallized patterns are as a whole radially outwardly extended from the central point of the die-pad 10. Namely, the respective line segments are relatively short.

If it is assumed that an imaginary straight line is provided over the surface of the die-pad 10 along an optional direction, the metallized pattern on the imaginary straight line will be discontinuous. Therefore, a stress, which would cause a deformation or curvature of the die-pad 10, will be prevented from generating continuously along an optional straight line, and the stress will be dispersed. Therefore, the generation of a deformation or a curvature of the semiconductor chip mounting board will be diminished.

Although the metallized pattern 14 consists of a plurality of zigzag shaped pattern lines, since the metallized pattern 14 extends continuously over the die-pad 10, the metallized pattern 14 is totally electrically conductive. Therefore, electroplating can easily be conducted on the overall surface of the die-pad 10 on which the metallized pattern is formed. Also, a semiconductor chip (not shown) which would be mounted on the die-pad 10 could be easily electrically connected to the metallized pattern 14 and, therefore, it would be possible to supply a power source to the back face of the semiconductor chip.

Also, since the metallized pattern 14 has such a shape that the generation of a deformation or a curvature of the semiconductor chip mounting board is prevented, it will be possible to maintain a relatively wider area covered by the metallized pattern 14 itself, as compared with an approach in which a generation of a deformation or curvature is restricted by simply reducing the area of the metallized pattern. Also, according to this embodiment, a necessary heat radiation efficiency can also be maintained.

As will be seen from FIG. 1, since the metallized pattern 14 according to this embodiment is symmetrically arranged with respect to a point, i.e., the central point of the die-pad 10, a thermal stress exerted on the die-pad 10 due to the differences in thermal expansion or thermal shrinkage between the base material 12 and the metallized pattern 14 can be uniformly dispersed and, thereby, the generation of a deformation of the semiconductor chip mounting board due to a curvature of the die-pad 10 can also be prevented.

If a part, or the whole, of the surface on which the metallized pattern 14 is formed is subjected to a plating process, or if a part, or the whole, of the surface of the die-pad 10 on which the metallized pattern 14 is formed is coated with a resist, the surface of the metallized pattern 14 can advantageously be protected. If the surface is plated with, for example, gold any corrosion on the surface of the metallized pattern 14 is prevented. If the surface of the die-pad 10 is coated with a resist, such as a solder resist, the metallized pattern 14 will be protected from the outside environments and adhesion to a semiconductor chip will be improved.

However, in the same manner as for the metallized pattern 14, since there are differences in thermal expansion or thermal shrinkage between the base material 12 and the solder resist, a stress may be generated on the board. In addition, a solder resist is also coated on a surface opposite to the metallized pattern surface of the semiconductor chip mounting board to attach solder balls or lead pins thereto. Therefore, depending upon a thickness of the solder resist or a coated area thereof, a stress may be generated on the board. Nevertheless, these problems can be solved by forming the solder resist as a pattern which is in conformity with the metallized pattern 14.

Figure 3:
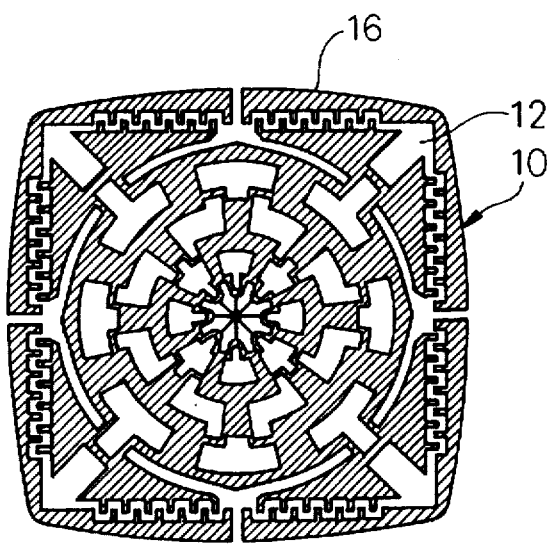
FIG. 3 is a plan view showing a metallized pattern of a die-pad according to a second embodiment of this invention.

FIG. 3 is a plan view of a metallized pattern of a second embodiment of a semiconductor chip mounting board. In the second embodiment, a metallized pattern 16 formed on the die-pad area 10 is arranged in such a manner that a plurality of zigzag shaped patterns extend along optional imaginary concentric circles having a common center at the central point of the die-pad area 10. As clearly understood from FIG. 3, the zigzag shaped metallized pattern is arranged symmetrically with respect to a point, i.e., the central point, and vertical, horizontal and oblique straight lines crossing on the central point. Therefore, if it is assumed that an imaginary straight line is provided over the surface of the die-pad 10 along an optional direction, the metallized pattern 16 on the imaginary straight line will be discontinuous.

Therefore, in the same manner as in the first embodiment, a thermal stress exerted on the metallized patterns 16 due to the differences in thermal expansion or thermal shrinkage between the base material 12 and the metallized pattern 16 will not be generated along a certain direction and, therefore, can be uniformly dispersed, whereby a generation of a deformation of the semiconductor chip mounting board due to a curvature of the die-pad 10 can be prevented.

Figure 4:
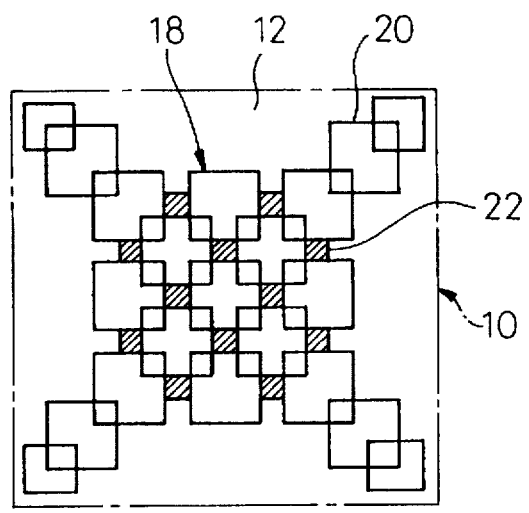
FIG. 4 is a plan view showing a metallized pattern of a die-pad according to a third embodiment of this invention.

A third embodiment will now be described with reference to FIG. 4. In this embodiment, a metallized pattern 18 formed on the die-pad area 10 has such a shape that a plurality of closed loop frames 20 which are arranged in a zigzag manner are overlapped on each other. In this particular embodiment, the closed loop frames are rectangular in shape and the corner portions of the respective rectangular frames are overlapped on the corner portions of the adjacent rectangular frames. Thus, the metallized pattern 18 can advantageously be formed on the die-pad 10 with a preferable balance. As clearly understood from FIG. 4, the metallized pattern is arranged symmetrically with respect to a point, i.e., the central point, and vertical, horizontal and oblique straight lines crossing the central point. Therefore, if it is assumed that an imaginary straight line is provided over the surface of the die-pad 10 along an optional direction, the metallized patterns 18 on the imaginary straight line will be discontinuous.

Therefore, in the same manner as in the previous embodiments, a thermal stress exerted on the metallized patterns 18 due to the differences in thermal expansion or thermal shrinkage between the base material 12 and the metallized pattern 18 will not be generated along a certain direction and, therefore, can be uniformly dispersed, whereby generation of a deformation of the semiconductor chip mounting board due to a curvature of the die-pad 10 can be prevented. It should be noted that the closed loop frame may not only be rectangular in shape, but it may also be circular, oval, polygonal, or the like in shape or in various combinations of these shapes.

The portion indicated by reference numeral 22 consists of contacts, which are particular parts of the metallized pattern 18, plated with a suitable metal such as gold, and exposed from the solder resist which covers all the area of the die-pad 10, except for the plated portions of metallized pattern 18. Thus, in order that only the particular parts of the metallized pattern 18 are plated with gold and exposed, at least portions of the metallized pattern 18, which are not to be plated, are coated with solder resist and an electroplating process is conducted by connecting the metallized pattern 18 to an electrical potential. In this particular embodiment, the surface of the base material 12 is also coated with solder resist for protecting the same. The contacts 22 are electrically connected with the back surface of the semiconductor chip when it comes into contact therewith, so that an electrical voltage can be supplied to the semiconductor chip.

Figure 5:
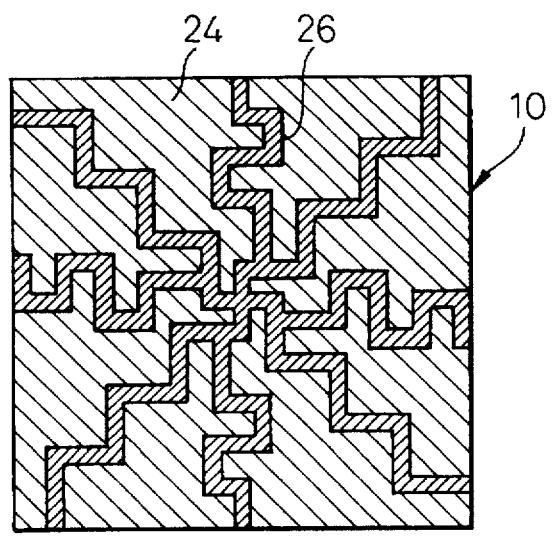
FIG. 5 is plan view showing a metallized pattern and solder resist pattern of the die-pad according to a fourth embodiment of this invention.
Figure 6:
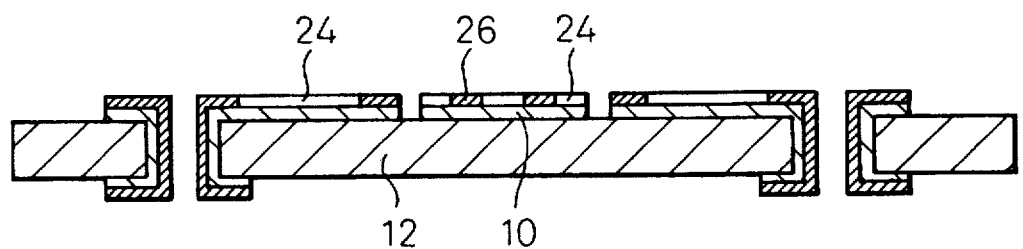
FIG. 6 is a cross-sectional view showing a whole structure of a semiconductor chip mounting board having the die-pad of FIG. 5.

FIGS. 5 and 6 are plan view and overall cross-sectional view of a fourth embodiment of a semiconductor chip mounting board, in which the metallized pattern is coated with solder resist except for the exposed areas which have appropriate shapes, whereby a curvature of the board is prevented during a plating process.

A base material 12 is made of resin and in this embodiment the whole surface of a die-pad 10 on which a semiconductor chip is to be mounted is a metallized pattern.

In order that the metallized pattern formed on the die-pad area 10 is arranged in such a manner that a plurality of zigzag shaped lines substantially radially and outwardly extend from an initial point, i.e., the central point of the die-pad 10, the metallized pattern is coated with solder resist except for the exposed portions. Therefore, the metallized pattern is coated with a pattern of a solder resist 24 and then subjected to a plating process. Thus, a plated layer 26 is formed only on the exposed metallized pattern.

Therefore, since the plated layer 26 can be formed in a zigzag shape, a stress will be prevented from being generated continuously along an optional straight line, but the stress will be dispersed. Therefore, the generation of a deformation or curvature of the semiconductor chip mounting board will be diminished.

In addition, the metallized pattern may be exposed in a zigzag manner along optional imaginary concentric circles having a common center at the central position of the die-pad and coated with solder resist except for the exposed portions, or the metallized pattern may also be exposed in such a manner that a plurality of closed loop frames are overlapped with respect to each other in a zigzag manner and are coated with solder resist except for the exposed portions. In these cases, the advantages and effects which are same as the above-mentioned embodiments of a semiconductor chip mounting board can be obtained.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

What we claim is:

1. A semiconductor chip mounting board comprising:
   a base material made of resin;
   a metallized pattern formed on a surface of said base material which defines a die-pad area on which a semiconductor chip is to be mounted and which is capable of electrically connecting a rear surface of the semiconductor chip to said metallized pattern via the die-pad area; and
   said metallized pattern comprising a plurality of zigzag shaped pattern lines along imaginary straight line segments radially, outwardly extending from a position on said die-pad area; and
   said metallized pattern extending continuously over the die-pad area.

2. A semiconductor chip mounting board as set forth in claim 1, wherein said metallized pattern is formed symmetrically with respect to a central portion of said die-pad area.

3. A semiconductor chip mounting board as set forth in claim 1, wherein said die-pad area on which said metallized pattern is formed is at least partially coated with a solder resist in areas where the metallized pattern is not formed.

4. A semiconductor chip mounting board as set forth in claim 1, wherein said die-pad area is coated with a solder resist, except in areas where said metallized pattern is formed.

5. A semiconductor chip mounting board as set forth in claim 1, wherein said metallized pattern is at least partially plated with a metal.

6. A semiconductor chip mounting board comprising:
   a base material made of resin;
   a metallized pattern formed on a surface of said base material which defines a die-pad area on which a semiconductor chip is to be mounted and which is capable of electrically connecting a rear surface of the semiconductor chip to said metallized pattern via the die-pad area; and
   said metallized pattern comprising a plurality of zigzag shaped pattern portions along imaginary concentric circles having a common center at a central position of said die-pad area, and
   said metallized pattern extending continuously over the die-pad area.

7. A semiconductor chip mounting board as set forth in claim 6, wherein said metallized pattern is formed symmetrically with respect to said central position of said die-pad area.

8. A semiconductor chip mounting board as set forth in claim 7, wherein said metallized pattern is formed symmetrically with respect to X and Y lines perpendicular to each other and crossing at said central position of said die-pad area.

9. A semiconductor chip mounting board as set forth in claim 6, wherein said die-pad area on which said metallized pattern is formed is at least partially coated with a solder resist in areas where the metallized pattern is not formed.

10. A semiconductor chip mounting board as set forth in claim 6, wherein said die-pad area is coated with a solder resist, except in areas where said metallized pattern is formed.

11. A semiconductor chip mounting board as set forth in claim 6, wherein said metallized pattern is at least partially plated with a metal.

12. A semiconductor chip mounting board comprising:

a base material made of resin;

a metallized pattern formed on a surface of said base material which defines a die-pad area on which a semiconductor chip is to be mounted and which is capable of electrically connecting a rear surface of the semiconductor chip to said metallized pattern via the die-pad area; and said metallized pattern comprising a plurality of closed loop shaped frames which overlap each other in a zigzag manner, and said metallized pattern extending continuously over the die-pad area.

13. A semiconductor chip mounting board as set forth in claim 12, wherein said closed loop shaped frames are rectangular and corner portions of said rectangular frames are overlapped on corner portions of adjacent rectangular frames.

14. A semiconductor chip mounting board as set forth in claim 12, wherein said metallized pattern is formed symmetrically with respect to a central position of said die-pad area.

15. A semiconductor chip mounting board as set forth in claim 14, wherein said metallized pattern is formed symmetrically with respect to X and Y lines perpendicular to each other and crossing at said central position of said die-pad area.

16. A semiconductor chip mounting board as set forth in claim 12, wherein said die-pad area on which said metallized pattern is formed is at least partially coated with a solder resist in areas where the metallized pattern is not formed.

17. A semiconductor chip mounting board as set forth in claim 12, wherein said die-pad area is coated with a solder resist, except in areas where said metallized pattern is formed.

18. A semiconductor chip mounting board as set forth in claim 12, wherein said metallized pattern is at least partially plated with a metal.

19. A semiconductor chip mounting board comprising:

a base material made of resin;

a metallized layer formed on a surface of said base material which defines a die-pad area on which a semiconductor chip is to be mounted and which is capable of electrically connecting a rear surface of the semiconductor chip to said metallized layer via the die-pad area;

said metallized layer being coated with solder resist except for a predetermined exposed pattern, said exposed pattern comprising a plurality of zigzag shaped pattern lines; and a plated metal layer formed only on said exposed pattern, said plated metal layer comprising a zigzag shaped metallized pattern, and said metallized pattern extending continuously over the die-pad area.

20. A semiconductor chip mounting board as set forth in claim 19, wherein said metallized pattern is formed symmetrically with respect to a central position of said die-pad area.

21. A semiconductor chip mounting board as set forth in claim 20, wherein said metallized pattern is formed symmetrically with respect to X and Y lines perpendicular to each other and crossing at said central position of said die-pad area.

22. A semiconductor chip mounting board comprising a metallized pattern formed on a surface of a base material, said metallized pattern defining a die-pad area on which a semiconductor chip is to be mounted and extending continuously over the die-pad area, said metallized pattern including a plurality of zigzag shaped pattern lines radially and outwardly extending from a position on said die-pad area.

* * * * *